INVENTOR
STANFORD R. OVSHINSKY by: Wallenstein, Spangenberg
& Hattis
ATTYS.

INVENTOR
STANFORD R. OVSHINSKY
by: Wallenstein, Spangenberg & Hattis ATTYS.

United States Patent Office 3,327,302

Patented June 20, 1967

3,327,302

ANALOG-TO-DIGITAL CONVERTER EMPLOYING SEMICONDUCTOR THRESHOLD DEVICE AND DIFFERENTIATOR CIRCUIT

Stanford R. Ovshinsky, Birmingham, Mich., assignor, by mesne assignments, to Energy Conversion Devices, Inc., Troy, Mich., a corporation of Delaware Filed Apr. 10, 1964, Ser. No. 358,837
7 Claims. (Cl. 340—347)

This application is a continuation-in-part of copending applications Ser. No. 118,642, filed June 21, 1961 and abandoned; Ser. No. 226,843, filed Sept. 28, 1962 and forfeited; Ser. No. 252,510, filed Jan. 18, 1963 and abandoned; Ser. No. 252,511, filed Jan. 18, 1963 and forfeited; Ser. No. 252,467, filed Jan. 18, 1963 and abandoned; Ser. No. 288,241, filed June 17, 1963 and abandoned; and Ser. No. 310,407, filed Sept. 20, 1963 now U.S. Patent No. 3,271,591.

The present invention relates to an analog to digital converter circuit wherein a signal in the form of a voltage having a varying or fixed magnitude is converted to a signal which indicates preferably in digital form the range of value in which the value of the input voltage is located although some aspects of the invention have a broader application. The present invention involves a unique application of a very recent development in semiconductor devices disclosed in the above-identified applications. This new development is a bi-directional semiconductor device of a type to be referred to herein as a threshold semiconductor device. This device is referred to in said application Ser. No. 310,407 as a "Mechanism Device."

The bi-directional threshold semiconductor device is a one-layer type semiconductor device which operates symmetrically in both directions of current flow therethrough and therefore has important application in A.C. circuits or in D.C. circuits where the applied voltage can have either polarity.

The threshold semiconductor device presents a very high resistance (e.g. one to ten megohms and higher) under normal voltage conditions of any polarity, a very low resistance (about one ohm or less) when a voltage of any polarity above a given threshold level is applied thereto, the change from the high to the low resistance condition occurring substantially instantaneously, and automatically resets itself substantially instantaneously to its high resistance state when the current flowing therethrough drops below a holding current level which is usually near zero.

The various forms of the present invention take advantage of the characteristics of the threshold semiconductor device described above in providing a unique and advantageous analog to digital converter circuit. In accordance with the present invention, the threshold semiconductor device is connected in a series circuit including a source of voltage which may be a progressively varying voltage which may exceed many times the upper threshold voltage level of the device and a capacitor. The source of voltage may produce a voltage indicating the instantaneous variations in value of a variable whose value range is to be indicated by the analog to digital converter circuit or it may represent the exponential voltage across a capacitor which is connected through a resistor to a source of a fixed unknown voltage whose value range is to be indicated. Assuming that such voltage increases from zero, as soon as the voltage reaches the threshold voltage level of the threshold semiconductor device, the same will be triggered or fired into its conducting state or condition. The time constant of the series circuit including the threshold semiconductor device and the first mentioned capacitor is such that the capacitor will charge up substantially instantaneously to the input voltage at the time the device becomes conductive. When the capacitor is thus fully charged the current flow in the series circuit drops to zero which causes the threshold semiconductor device to revert to its blocking state or condition.

The threshold semiconductor device will be fired momentarily into its conducting state or condition each time the input voltage increases or decreases from the value thereof which last fired the threshold semiconductor device an amount equal to the said threshold level of the device. The firing of the threshold semiconductor device resulting from an increase in the applied voltage results in a charge of the capacitor and the flow of a current pulsation in one direction through the series circuit whereas the firing of the device resulting from a decrease in the applied voltage results in a discharge of the capacitor and the flow of a current pulsation in the opposite direction therethrough. The voltage across the capacitor will have a stepped waveform following the various voltages which effect firing of the threshold semiconductor device into its conducting state. The spacing and polarity of the current pulsations in the series circuit indicate the magnitude and direction of the slope of the input voltage waveform.

Means are preferably provided for detecting each pulse of current flowing in the circuit during charge and discharge of the capacitor, and for counting each current pulse resulting from the charge of the capacitor and subtracting from this count each current pulse of opposite polarity resulting from the discharge of the capacitor occurring under the circumstances to be described. The resultant count indicates the current voltage across the capacitor which indicates the range within which the value of the input voltage is located.

For a better understanding of the operation of a bi-directional threshold semiconductor device and its application to several forms of the present invention, reference should now be made to the specifications to follow, the claims and the drawings wherein:

Figure 1:
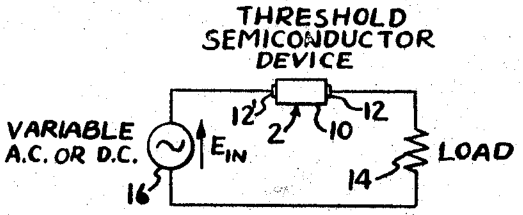
FIG. 1 is a schematic representation of the threshold semiconductor device described above in a circuit including a load and a source of voltage for controlling the load.

For an understanding of the nature and manner of operation of the threshold semiconductor device referred to above, reference should first be made to FIGS. 1 through 4A of the drawings. In FIG. 1, which illustrates a typical simple load circuit for the threshold semiconductor device 2, the device is shown as including a body 10 which may take a variety of forms. The body has as a surface film or as the entire body 10 or as a part thereof an active bi-directional semiconductor material having unique and advantageous properties to be described. The body 10 includes a pair of electrodes 12–12' electrically connecting the same with a load 14 and a source of voltage 16. In accordance with the broadest aspects of the invention, the source of voltage may be either an A.C. or a D.C. voltage. However, in the forms of the invention to be described, it will be assumed that the source of voltage 16 will be a source of D.C. voltage which progressively varies. The load 14 is illustrated as a resistor solely to simplify or generalize the description of the operation of the threshold semiconductor device. In the circuits of the present invention the load is a capacitor whose function will be later described.

The threshold semiconductor device is symmetrical in its operation and contains nonrectifying active solid state semiconductor materials and electrodes in nonrectifying contact therewith for controlling the current flow therethrough substantially equally in either or both directions. In their high resistance or blocking conditions these materials may be crystalline like materials or, preferably, materials of the polymeric type including polymeric networks and the like having covalent bonding and crosslinking highly resistant to crystallization, which are in a locally organized disordered solid state condition which is generally amorphous (not crystalline) but which may possibly contain relatively small crystals or chains or ring segments which would probably be maintained in randomly oriented position therein by the crosslinking. These polymeric structures may be one, two or three dimensional structures. While many different materials may be utilized, for example, these materials can be tellurides, selenides, sulfides or oxides of substantially any metal, or metalloid, or intermetallic compound, or semiconductor or solid solutions or mixtures thereof, particularly good results being obtained where tellurium or selenium are utilized.

It is believed that the cooperating materials (metals, metalloids, intermetallic compounds or semiconductors), which may form compounds, or solid solutions or mixtures with the other materials in the solid state semiconductor materials operate, or have a tendency to operate, to inhibit crystallization in the semiconductor materials, and it is believed that this crystallization inhibiting tendency is particularly pronounced where the percentages of the materials are relatively remote from the stoichiometric and eutectic ratios of the materials, and/or where the materials themselves have strong crystal inhibiting characteristics, such as, for example, arsenic, gallium and the like. As a result, where, as here, the semiconductor materials have strong crystallization inhibiting characteristics, they will remain or revert, to a disordered or generally amorphous state.

The following are specific examples of some of the semiconductor materials which have given satisfactory results in a threshold semiconductor device (the percentages being by weight):

25% arsenic and 75% of a mixture 90% tellurium and 10% germanium; also, with the addition of 5% silicon;
75% tellurium and 25% arsenic;
71.8% tellurium, 14.05% arsenic, 13.06% gallium and the remainder lead sulfide;
72.6% tellurium, 14.2% arsenic and 13.2% gallium;
72.6% tellurium, 27.4% gallium arsenide;
85% tellurium, 12% germanium and 3% silicon;
50% tellurium, 50% gallium;
67.2% tellurium, 25.3% gallium arsenide and 7.5% n-type germanium;
75% tellurium and 25% silicon;
75% tellurium and 25% indium antimonide;
55% tellurium and 45% germanium;
45% tellurium and 55% germanium;
75% selenium and 25% arsenic;
50% aluminum telluride and 50% indium telluride; and
50% aluminum telluride and 50% gallium telluride In forming the solid state semiconductor materials, the materials may be ground in an unglazed porcelain mortar to an even powder consistency and thoroughly mixed. They then may be brazed in a sealed quartz tube to above the melting point of the material which has the highest melting point. The molten materials may be cooled in the tube and then broken or cut into pieces, with the pieces ground to proper shape to form the bodies

10, or the molten materials may be cast from the tube into preheated graphite molds to form the bodies. The initial grinding of the materials may be done in the presence of air or in the absence of air, the former being preferable where considerable oxides are desired in the ultimate bodies 10. Alternatively, in forming the bodies 10, it may be desirable to press the mixed powdered materials under pressures up to at least 1000 p.s.i. until the powdered materials are completely compacted, and then the completely compacted materials may be appropriately heated.

In some instances it has been found, particularly where arsenic is present in the bodies 10 formed in the foregoing manner, that the bodies are in a disordered or generally amorphous solid state or condition, the high resistance or blocking state. In such instances, bare electrodes can be and have been embedded in the bodies during the formation thereof, and can be and have been applied to the surfaces thereof, to provide threshold semiconductor devices wherein the control of the electric current is accomplished in the bulk of the solid state semiconductor materials.

In other instances, it has been found that the bodies 10 formed in the foregoing manner are in a crystalline like solid state, which may be a low resistance or conducting state or condition, probably due to the slow cooling of the semiconductor materials during the formation of the bodies. In these instances, it is necessary to change the bodies or the surfaces thereof to a disordered or generally amorphous state, and this may be accomplished in various ways, as for example: utilizing impure materials, adding impurities; including oxides in the bulk and/or in the surfaces or interfaces; mechanically by machining, sand blasting, impacting, bending, etching or subjecting to ultrasonic waves; metallurgically forming physical lattice deformations by heat treating and quick quenching or by high energy radiation with alpha, beta or gamma rays; chemically by means of oxygen, nitric or hydrofluoric acid, chlorine, sulphur, carbon, gold, nickel, iron or manganese inclusions, or ionic composition inclusions comprising alkali or alkaline earth metal compositions; electrically by electrical pulsing; or combinations thereof.

Where the entire bodies are changed in any of the foregoing manners to a disordered or generally amorphous solid state, bare electrodes may be embedded therein during the formation of the bodies and the current control by such solid state current controlling devices would be in the bulk. Another manner of obtaining current control in the bulk is to embede in the bodies electrodes which, except for their tips, are provided with electrical insulation, such as an oxide of the electrode material. Current pulses are then applied to the electrodes to cause the effective semiconductor material between the uninsulated tips of the electrodes to assume a disordered or generally amorphous solid state.

The control of current by the threshold semiconductor devices can also be accomplished by surfaces or films of the semiconductor materials, particularly good results being here obtained. Here, the bodies of the semiconductor material, which are in a low resistance crystalline like solid state, may have their surfaces treated in the foregoing manners to provide surfaces or films which are in a disordered or generally amorphous solid state. Electrodes are suitably applied to the surfaces or films of such treated bodies, and since the bulk of the bodies is in the crystalline like solid state and the surfaces or films are in a disordered or generally amorphous state (high resistance or substantially an insulator), the control of the current between the electrodes is mainly accomplished by the surfaces or films.

Instead of forming the complete body 10, the foregoing solid state semiconductor materials may be coated on a suitable smooth substrate, which may be a conductor or an insulator as by vacuum deposition or the like, to provide surfaces or films of the semiconductor material on the substrate which surfaces or films are in a disordered or generally amorphous solid state (high resistance or substantially an insulator). The solid state semiconductor materials normally assume this state probably because of rapid cooling of the materials as they are deposited or they may be readily made to assume such state in the manners described above. Electrodes are suitably applied to the surfaces or films on the substrate and the control of the current is accomplished by the surfaces or films. If the substrate is a conductor, the control of the current is through the surfaces or films between the electrodes and the substrate, and, if desired, the substrate itself may form an electrode. If the substrate is an insulator, the control of the current is along the surfaces or films between the electrodes. A particularly satisfactory device which is extremely accurate and repeatable in production has been produced by vapor depositing on a smooth substrate a thin film of tellurium, arsenic and germanium and by applying tungsten electrodes to the deposited film. The film may be formed by depositing these materials at the same time to provide a uniform and fixed film, or the film may be formed by depositing in sequence layers of tellurium, arsenic, germanium, arsenic and tellurium, and the latter case, the depositioned layers are then heated to a temperature below the sublimation point of the arsenic to unify and fix the film. The thickness of the surfaces of films, whether formed on the bodies by suitable treatment thereof or by deposition on substrates may be in a range up to a thickness of a few ten thousandths of an inch or even up to a thickness of a few hundredths of an inch or more.

The electrodes which are utilized in the threshold semiconductor devices may be substantially any good electrical conductor, such as graphite, or metals such as tungsten, tantalum, niobium and molybdenum which are high melting point conductive materials. These materials are usually relatively inert with respect to the various aformentioned semiconductor materials.

The electrodes when not embedded in the bodies 10 in the instances discussed above, may be applied to the surfaces or films of bodies, or to the surfaces or films deposited on the substrates in any desired manner, as by mechanically pressing them in place, by fusing them in place, by soldering them in place, by vapor deposition or the like. Preferably, after the electrodes are applied, a pulse of voltage and current is applied to devices for conditioning and fixing the electrical contact between the electrodes and the semiconductor materials. The current controlling devices may be encapsulated if desired.

It is believed that the generally amorphous polymeric like semiconductor materials have substantial current carrier restraining centers and a relatively large energy gap, that they have a relatively small mean free path for the current carriers, large spatial potential fluctuations and relatively few free current carriers due to the amorphous structure and the current carrier restraining centers therein for providing the high resistance or blocking state or condition. It is also believed that the crystalline like materials in their high resistance or blocking state or condition have substantial current carrier restraining centers, and have a relatively large mean free path for the current carriers due to the crystal lattice structure and hence a relatively high current carrier mobility but that there are relatively few free current carriers due to the substantial current carrier restraining centers therein, a relatively large energy gap therein, and large spatial potential fluctuations therein for providing the high resistance or blocking state or condition. It is further believed that the amorphous type semiconductor materials may have a higher resistance at the ordinary and usual temperatures of use, a greater non-linear negative temperature-resistance coefficient, a lower heat conductivity coefficient, and a greater change in electrical conductivity between the blocking state or condition and the conducting state or condition than the crystalline type of semiconductor materials, and thus be more suitable for many applications of this invention. By appropriate selection of materials and dimensions, the high resistance values may be predetermined and they may be made to run into millions of ohms, if desired.

As an electrical field is applied to the semiconductor materials (either the crystalline type or the amorphous type) of a device of this invention in its blocking state or condition, such as a voltage applied to the electrodes, the resistance of at least portions or paths of the semiconductor material between the electrodes decreases gradually and slowly as the applied field increases until such time as the applied field or voltage increases to a threshold value, whereupon said at least portions of the semiconductor material, at least one path between the electrodes, are substantially instantaneously changed to a low resistance or conducting state or condition for conducting current therethrough. It is believed that the applied threshold field or voltage causes firing or breakdown or "switching" of said at least portions or paths of the semiconductor material, and that the breakdown may be electrical or thermal or a combination of both, the electrical breakdown caused by the eletcrical field or voltage being more pronounced where the distance between the electrodes is small, as small as a fraction of a micron or so, and the thermal breakdown caused by the electrical field or voltage being more pronounced for greater distances between the electrodes. For some crystalline like materials the distances between the electrodes can be so small that barrier rectification and p-n junction operation are impossible due to the distances being beneath the transition length or barrier height. The "switching" time for switching from the blocking state to the conducting state are extremely short, less than a few microseconds.

The electrical breakdown may be due to rapid release, multiplication and conduction of current carriers in avalanche fashion under the influence of the applied electrical field or voltage, which may result from external field emission, internal field emission, impact or collision ionization from current carrier restraining centers (traps, recombination centers or the like), impact or collision ionization from valence bands, much like that occurring at breakdown in a gaseous discharge tube, or by lowering the height or decreasing the width of possible potential barriers and tunneling or the like may also be possible. It is believed that the local organization of the atoms and their spatial relationship in the crystal lattices in the crystalline type materials and the local organization and the spatial relationship between the atoms or small crystals or chain or ring segments in the amorphous type materials, at breakdown, are such as to provide at least a minimum mean free path for the current carriers released by the electrical field or voltage which is sufficient to allow adequate acceleration of the free current carriers by the applied electrical field or votlage to provide the impact or collision ionization and electrical breakdown. It is also believed that such a minimum mean free path for the current carriers may be inherently present in the amorphous structure and that the current conducting condition is greatly dependent upon the local organization for both the amorphous and crystalline conditions. As expressed above, a relatively large mean free path for the current carriers can be present in the crystalline structure.

The thermal breakdown may be due to Joule heating of said at least portions or paths of the semiconductor material by the applied electrical field or voltage, the semiconductor material having a substantial non-linear negative temperature-resistance coefficient and a minimal heat conductivity coefficient, and the resistance of said at least portions or paths of the semiconductor material rapidly decreasing upon such heating thereof. In this respect, it is believed that such decrease in resistance increases the current and rapidly heats by Joule heating said at least portions or paths of the semiconductor material to thermally release the current carriers to be accelerated in the mean free path by the applied electrical field or voltage to provide for rapid release, multiplication and conduction of current carriers in avalanche fashion and, hence, breakdown, and, especially in the amorphous condition, the overlapping of orbitals by virtue of the type of local organization can create different sub-bands in the band structure.

It is also believed that the current so initiated between the electrodes at breakdown (electrically, thermally or both) causes at least portions or paths of the semiconductor material between the electrodes to be substantially instantaneously heated by Joule heat, that at such increased temperatures and under the influence of the electrical field or voltage, further current carriers are released, multiplied and conducted in avalanche fashion to provide high current density, and a low resistance or conducting state or condition which remains at a greatly reduced applied voltage. It is possible that the increase in mobility of the current carriers at higher temperature and higher electric field strength is due to the fact that the current carriers being excited to higher energy states populate bands of lower effective mass and, hence, higher mobility than at lower temperatures and electric field strengths. The possibility for tunneling increases with lower effective mass and highetr mobility. It is also possible that a space charge can be established due to the possibility of the current carriers having different masses and mobilities and since an inhomogeneous electric field could be established which would continuously elevate current carriers from one mobility to another in a regenerative fashion. As the current densities of the devices decrease, the current carrier mobilities decrease and, therefore, their capture possibilities increase. In the conducting state or condition the current carriers would be more energetic than their surroundings and would be considered as being hot. It is not clear at what point the minority carriers present could have an influence on the conducting process, but there is a possibility that they may enter and dominate, i.e. become majority carriers at certain critical levels.

It is further believed that the amount of increase in the mean free path for the current carriers in the amorphous like semiconductor material and the increased current carrier mobility are dependent upon the amount of increase in temperature and field strength, and it is possible that said at least portions or paths of some of the amorphous like semiconductor materials are electrically activated and heated to at least a critical transition temperture, such as a glass transition temperature, where softening begins to take place. Thus, due to such increase in mean free path for the current carriers, the current carriers produced and released by the applied electrical field or voltage are rapidly released, multiplied and conducted in avalanche fashion under the influence of the applied electrical field or voltage to provide and maintain a low resistance or conducting state or condition.

The voltage across the device in its low resistance or conducting state or condition remains substantially constant although the current may increase and decrease greatly. In this connection, it is believed that the conducting filaments or threads or paths between the electrodes increase and decrease in cross section as the current increases and decreases for providing the substantially constant voltage condition while conducting. When the current through said at least portions or paths of the semiconductor material decreases to a minimum current holding value which is near zero, it is believed that there is insufficient current to maintain the same in their low resistance or conducting state or condition, whereupon they substantially instantaneously change or revert to their high resistance or blocking state or condition. In other words, the conducting filaments or threads or paths between the electrodes are interrupted when this condition occurs. The decrease in current below the minimum current holding value may be brought about by decreasing the applied voltage to a low value. Said at least portions or paths of the semiconductor material may again be substantially instantaneously changed to their low resistance or conducting state or condition where they are again activated by the voltage applied thereto. The ratio of the blocking resistance to the resistance in the conducting state or condition is extremely high, as for example, larger than 100,000:1. In its low resistance or conducting state or condition the resistance may be as low as 1 ohm or less as determined by the small voltage drop thereacross and the holding current for the device may be near zero.

Figure 3:
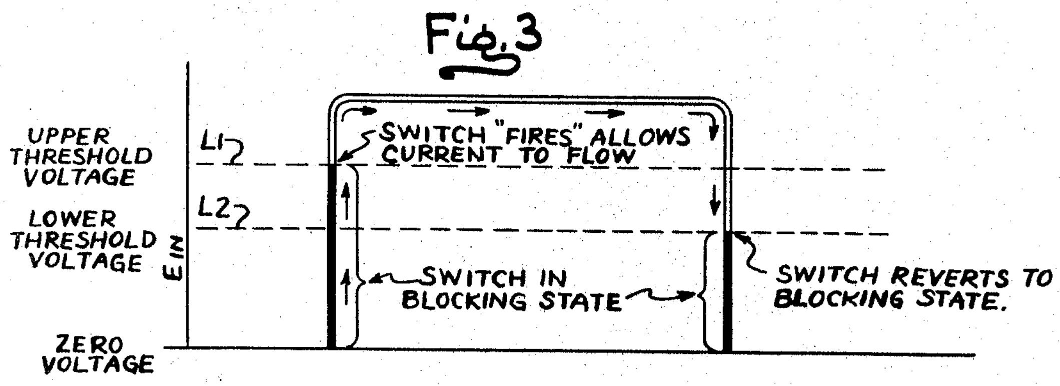
FIG. 3 is a diagram illustrating the operation of the threshold semiconductor device in FIG. 1.
Figure 4:
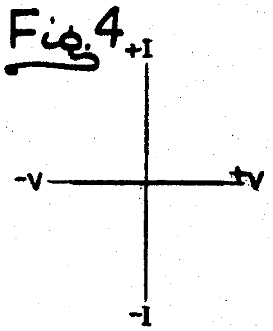
FIGS. 4 and 4A illustrate the voltage-current characteristics for the two operating states of the threshold semiconductor device of FIG. 1 in an A.C. load circuit.
Figure 4A:
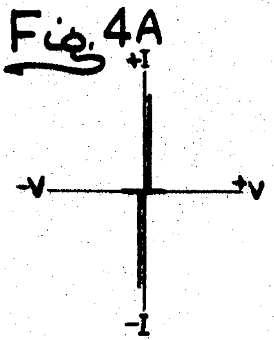

The voltage-current characteristics of the current controlling device are reversible and are generally independent of the load resistance and independent of whether D.C. or A.C. is used. The manner in which the current controlling device operates in a load circuit powered by an A.C. voltage (FIG. 1) is illustrated by the diagram of FIG. 3 and by the voltage-current curves of FIGS. 4 and 4*a*. When the device 2 is in its high resistance or blocking state or condition and the peak value of the applied A.C. voltage is less than the upper threshold or breakdown voltage value of the device, the device remains in its high resistance or blocking state or condition as indicated in FIGS. 3 and 4. When the peak value of the A.C. applied voltage is raised to the breakdown or upper threshold voltage level L1 shown in FIG. 3, the device fires and causes said at least portions or paths of the semiconductor material to switch or change to the low resistance or conducting state or condition as indicated in FIGS. 3 and 4A. It is noted that the vertical portions of the curve in FIG. 4A are slightly off-set from the zero voltage center point which curve portions represent the small resistance of the device 2 and the small and substantially constant voltage drop thereacross in its low resistance or conducting state or condition. In this condition there is a constant ratio of voltage change to current change in the device 2, the voltage drop thereacross is a minor fraction of the voltage drop across the active semiconductive material of the device in the blocking condition thereof and the low voltage drop thereacross in the conducting condition of the device is the same for increase and decrease in the instantaneous current above the minimum current holding value. It is also noted in FIG. 4A that the device intermittently assumes its high resistance or blocking state or condition each half cycle of the A.C. voltage as the instantaneous voltage nears zero and drops the current below the minimum current holding value, the current being momentarily interrupted during each half cycle. However, following each momentary half cycle interruption of the current flow, the low resistance state or condition of said at least portions or paths of the semiconductor material resumes the next half cycle when the instantaneous value of the applied voltage reaches a certain level L2 in FIG. 3 which is at times substantially below the upper threshold voltage level, especially where the active semi-conductor material has any appreciable thickness where heat dissipation is less than ideal. However, other factors than temperature could also possibly be responsible for the presence of a lower threshold voltage level. The semiconductor device is considered to be in its conducting state or condition despite its momentary return to the high resistance state or condition each half cycle. However, when the peak value of the A.C. voltage is decreased below the lower threshold voltage level L2, the low resistance state or condition does not resume each half cycle and the device is then considered to be in a blocking state or condition, this being illustrated in FIGS. 3 and 4. After the device becomes non-conducting, it cannot again become conducting until the peak voltage of the applied A.C. voltage becomes at least as great as the upper threshold voltage level L1 of the device to produce the voltage-current curve of FIG. 4A.

Figure 2:
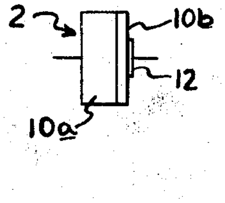
FIGS. 2, 2A and 2B illustrate a few exemplary physical forms of the threshold semiconductor device shown in FIG. 1.
Figure 2A:
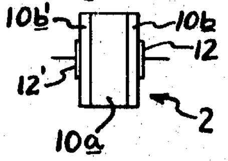
Figure 2B:
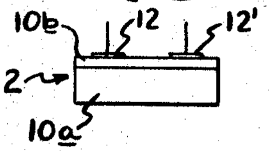

FIGS. 2, 2A and 2B illustrate some exemplary physical forms of the threshold semiconductor device 2. They comprise an inactive and conducting body portion 10a of metal or the like or an inactive and conducting semiconductor material and one or more active semiconductor layers or films 10b–10b′ made in the manner described above. The electrodes 12 and 12′ may comprise separate layers of metal or the like as illustrated in the embodiments of FIGS. 2A and 2B or one of the electrodes 12 may be formed by the conductive body portion 10a as illustrated in the embodiment of FIG. 2.

Figure 5:
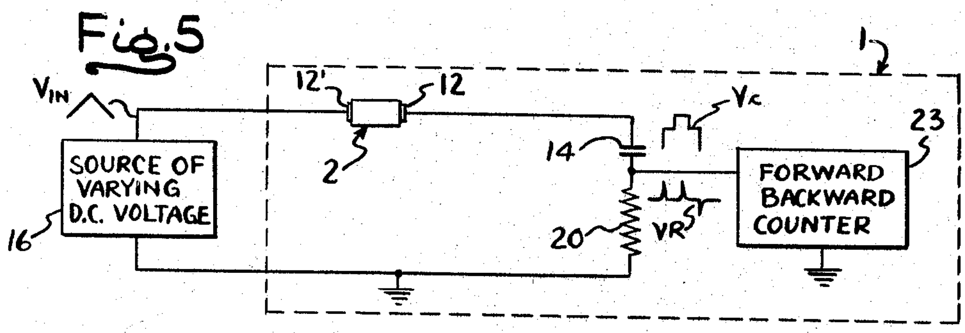
FIG. 5 illustrates a basic circuit of the present invention.
Figures 6, 6A, 6B:
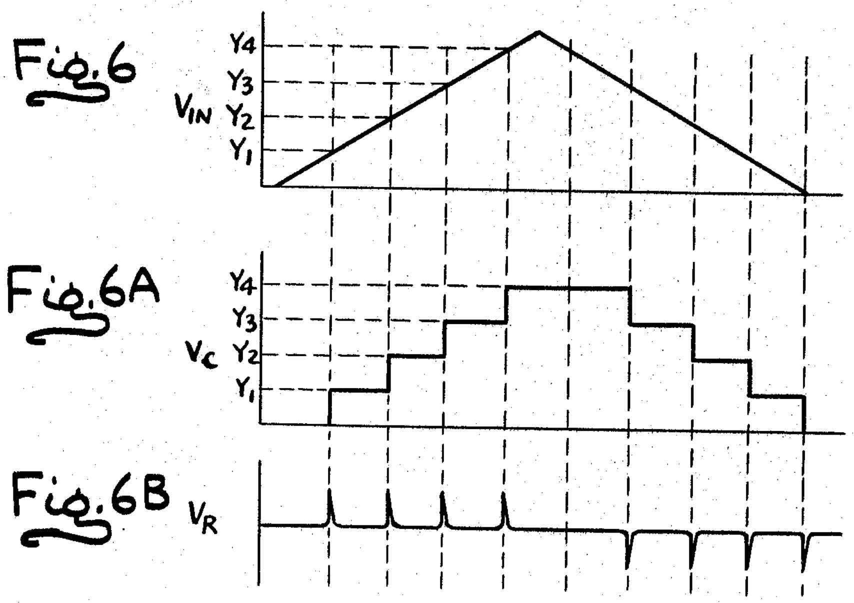
FIGS. 6, 6A and 6B are voltage waveforms in various parts of the circuit of FIG. 5.

Refer now to FIG. 5 which shows the application of the threshold semiconductor device described above in which is an analog to digital converter circuit. As illustrated, in addition to a source of varying D.C. voltage 16 and a threshold semiconductor device 2 there is provided a capacitor 14 and a small resistance 20. It will be assumed that the output of the source of voltage 16 will be a voltage which progressively varies with time, as for example, shown by the waveform in FIG. 6. It is further assumed that this voltage starts from zero as indicated and progressively increases to a value Y4 which is many times (e.g. 4) the upper threshold voltage level of the threshold semiconductor device 2 and then gradually decreases to zero. The voltage levels Y1, Y2, and Y3 between zero voltage and if voltage Y4 are assumed respectively to occur at one, two and three times the upper threshold voltage level of the threshold semiconductor device 2. FIG. 6A shows the resulting voltage across the capacitor 14 and FIG. 6B illustrates the current pulses flowing through the capacitor charge circuit.

A forward-backward counter 23 responds to the current pulsations passing through the resistance 20. The counter is designed so that the count in the counter 23 increases one unit each time a capacitor charging current pulsation flows through the resistance 20 and decreases one count each time a capacitor discharging current pulsations flows through the resistance 20.

When the input voltage follows the waveform shown in FIG. 6 instantly as the input voltage reaches the level Y1 (FIG. 6), the threshold semiconductor device 2 will be triggered into its conducting state and, due to the short time constant of the capacitor charge circuit, the capacitor 14 will substantially instantaneously charge to the voltage level Y1. When the capacitor 14 is fully charged, current flow ceases in the circuit and threshold semiconductor device reverts to its blocking state or condition. Due to the large leakage resistance of the threshold semiconductor device, the voltage on the capacitor 14 will be maintained substantially at the level Y1. The resultant voltage appearing across the terminals 12–12′ of the threshold semiconductor device 2 will now be the magnitude of the input voltage minus the value of the voltage on the capacitor 14. The threshold semiconductor device 2 will be fired again when the magnitude of the input voltage reaches the level Y2 which is twice the upper threshold voltage level of the threshold semiconductor device 2. When this occurs, the resultant voltage across the terminals 12–12′ will be once again equal to the upper threshold voltage level of the threshold semiconductor device so the device 2 will again be rendered conductive and the capacitor 14 will substantially instantaneously charge to the voltage level Y2, and the device 2 will again become non-conductive when the charge current disappears. As the input voltage rises through the voltage levels Y3 and Y4, it is apparent that the threshold semiconductor device 2 will be fired two additional times and the voltage across the capacitor 14 will increase in two steps to the voltage level Y4 as shown in FIG. 6A.

When the input voltage decreases from a level which last caused the threshold semiconductor device 2 to fire, the resultant voltage across the terminals 12–12′ of the device will reverse in polarity for then the input voltage minus the voltage across the capacitor 14 will be a negative voltage rather than a positive voltage as before. When the input voltage decreases from this level (Y4) an amount equal to the upper threshold voltage level of the threshold semiconductor device 2, then the device will be triggered into conduction to effect a sudden discharge of the capacitor 14 to the current level of the input voltage whereupon the device will revert to its blocking state or condition as the flow of discharge current ceases. This sequence of operation is repeated as the input voltage decreases from the value Y4 through the values Y3, Y2 and Y1. FIG. 6B illustrates the reverse of the direction of the current pulsation in the circuit as the capacitor 14 discharges in steps as the input voltage passes through the voltage levels Y3, Y2 and Y1 of the input voltage waveform.

The input voltage waveform can increase or decrease in any fashion and the circuit will operate in the general manner described above so long as the waveform varies at a slow enough rate that the capacitor 14 substantially instantaneously charges to the value of the voltage which effected the firing of the threshold semiconductor device 2. In such case, the count in the forward-backward counter 23 will indicate the last input voltage level which effected the firing of the threshold semiconductor device 2.

Figures 7, 8:
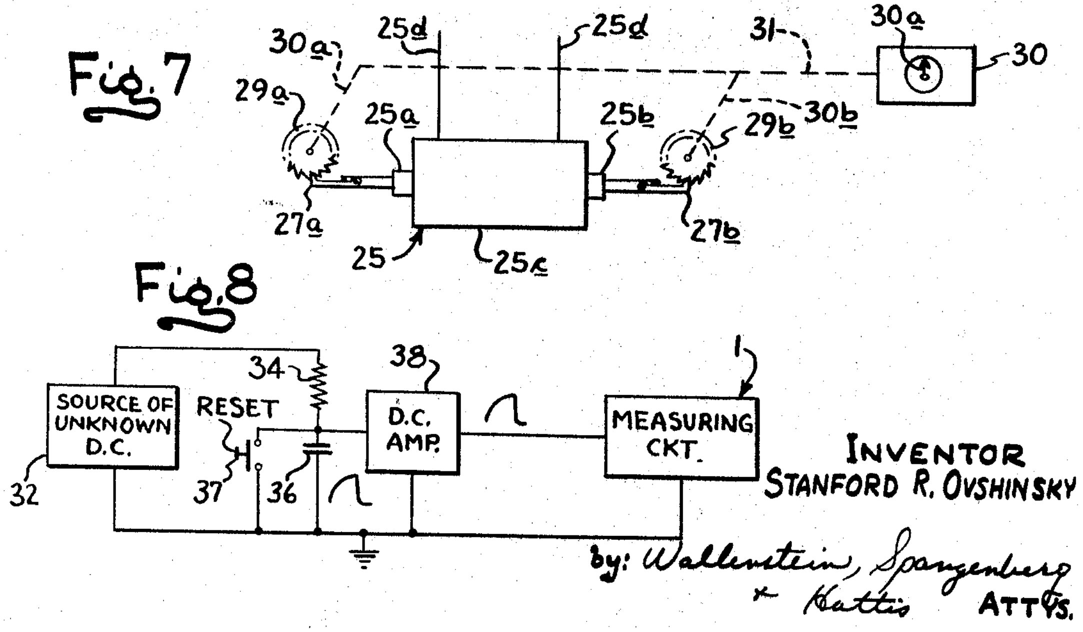
FIG. 7 illustrates an exemplary forward-backward counter mechanism useful in the circuit of FIG. 1.
FIG. 8 is a form of the present invention used to indicate the range of an unknown D.C. voltage.

The forward-backward counter 23 may take a variety of forms well-known in the art. FIG. 7 illustrates an electro-mechanical forward-backward counter which could be used in the circuit of FIG. 5. The counter includes a solenoid 25 which has armature sections 25a and 25b projecting respectively beyond opposite ends of the solenoid 25 and spring-urged into a neutral position as illustrated. The armature portion section 25a has a pawl 27a on the end thereof which engages with a ratchet wheel 29a on a shaft 30a, the pawl 27a rotating the wheel 29a one tooth position as the pawl moves to the left of its neutral position. Movement of the pawl 27a to the right of its neutral position will not impart any movement to the wheel 29a. The other armature section 25b of the solenoid 25 has a pawl 27b on the end thereof which engages a ratchet wheel 29b on a shaft 30b. Upon movement of the pawl 27b is to the right from its neutral position, the ratchet wheel 29b is moved one tooth position in a direction opposite the direction of advancement of the ratchet wheel 29a by the pawl 27a. Any movement of the pawl 27b to the left of its neutral position will not impart any movement to the ratchet wheel 29b.

The solenoid 25 has a winding 25c with input conductors 25d—25d for connecting the winding in series with a signal representing the current pulsations in the capacitor charge circuit. To this end the winding 25c may replace the resistance 20 in FIG. 5. The shafts 30a and 30b on which the ratchet wheels are mounted are coupled to a common shaft 31 so each positive current pulsation flowing through the winding 25c will move the armature to the right of its neutral position and move the common shaft one angular unit in one direction and a negative current pulsation flowing through the winding will move the armature to the left of its neutral position and move the common shaft in angular unit in the opposite way.

It is apparent that the angular position of the common shaft is an indication of the number of positive current pulsations minus the total number of negative current pulsations which flow in the circuit of FIG. 1. This common shaft may be connected in a suitable way to an indicating device 30 having a scale over which a pointer 30a moves to indicate the value of the input voltage which last effected firing of the threshold semiconductor device 2.

The analog to digital converter circuit of FIG. 5 can be readily adapted to act as a circuit for indicating the range of an unknown fixed D.C. voltage of any polarity. The source of unknown voltage is indicated by reference numeral 32 in FIG. 8. A resistor 34 and a capacitor 36 are connected in series between the output of the source of unknown voltage 32 so as to form a capacitor charge circuit wherein the voltage across the capacitor 36 will gradually build-up to the value of the unknown voltage to be measured. A suitable normally-open reset switch 37 is connected across the capacitor 36 to effect discharge of the capacitor 36 to initiate a new voltage measurement. The voltage across the capacitor 36 may be fed to a suitable D.C. amplifier generally indicated by reference numeral 38. When the source of unknown voltage 32 is of a very small value, the D.C. amplifier is necessary to raise this voltage to a suitable level. The amplifier 38 also serves the important purpose of isolating the output circuit thereof from the source of the input voltage.

The output of the D.C. amplifier 38 becomes the source of varying D.C. voltage 16 as illustrated in FIG. 1. The measuring circuit in FIG. 8 has been indicated in box form identified by reference numeral 1 and encompasses the same elements shown by the dashed box indicated by reference numeral 1 in FIG. 5.

It should be understood that numerous modifications may be made in the most preferred forms of the invention described above without deviating from the broader aspects thereof.

I claim:

1. An analog to digital converter circuit for indicating the voltage range within which an input voltage is located, said circuit comprising a series circuit including a source of progressively varying input voltage to be measured, a capacitor, and a bi-directional threshold semiconductor device with load terminals connecting the device into the series circuit, said threshold semiconductor device including a semiconductor material having one condition wherein at least portions thereof between the load terminals have a high resistance where they act as insulators for blocking the flow of current therethrough in either or both directions when the applied voltage across the load terminals is below a threshold voltage level, and driven substantially instantaneously to another condition wherein said at least portions thereof between the load terminals have a low resistance and are conductors for conducting the flow of current therethrough in either or both directions when the applied voltage across the load terminals is raised above said threshold voltage level and reverting to said one condition when the current therethrough drops below a holding current level, the maximum value of the output of said progressively varying input voltage being a great many times the threshold voltage level of said threshold semiconductor device, wherein the semiconductor material of said device is driven into its conducting condition each time the difference between the input voltage and the voltage charge on the capacitor is in excess of the threshold level of the threshold semiconductor device, and reverts to said one blocking condition when the capacitor voltage reaches the new input voltage level where current flow therein ceases, the time constant of said series circuit being such that said capacitor charges or discharges substantially instantaneously to the input voltage when the threshold semiconductor device is driven into said conducting condition, and pulse counter means responsive to each current pulse resulting from a charging of said capacitor by increasing the count therein by one unit.

2. An analog to digital converter circuit for indicating the voltage range within which an input voltage is located, said circuit comprising a series circuit including a source of progressively varying input voltage to be measured which increases and decreases over a wide range of values, a capacitor, and a bi-directional threshold semiconductor device with load terminals connecting the device into the series circuit, said threshold semiconductor device including a semiconductor material having one condition wherein at least portions thereof between the load terminals have a high resistance where they act as insulators for blocking the flow of current therethrough in either or both directions when the applied voltage across the load terminals is below a threshold voltage level, and driven substantially instantaneously to another condition wherein said at least portions thereof between the load terminals have a low resistance and are substantially conductors for conducting the flow of current therethrough in either or both directions when the applied voltage across the load terminals is raised above said threshold voltage level and reverting to said one condition when the current therethrough drops below a holding current level, the maximum value of the output of said progressively varying input voltage being a great many times the threshold voltage level of said threshold semiconductor device, wherein the semiconductor material of said device is driven into its conducting condition each time the difference between the input voltage and the voltage charge on the capacitor is in excess of the threshold level of the threshold semiconductor device, and reverts to its blocking condition when the capacitor voltage reaches the new input voltage level where current flow therein ceases, the time constant of said series circuit being such that said capacitor charges or discharges substantially instantaneously to the input voltage when the threshold semiconductor device is driven into said conducting condition, and pulse counter means responsive to each current pulse resulting from a charging of said capacitor by increasing the count therein by one unit are responsive to each current pulse resulting from a discharging of said capacitor by decreasing its count therein by one unit.

3. An analog to digital converter circuit for indicating the voltage range within which an input voltage is located, said circuit comprising a series circuit including a source of progressively varying input voltage to be measured which increases and decreases over a wide range of value, a capacitor, and a bi-directional threshold semiconductor device with load terminals connecting the device into the series circuit, said threshold semiconductor device including a semiconductor material having one condition wherein at least portions thereof between the load terminals have a high resistance where they act as insulators for blocking the flow of current therethrough in either or both directions when the applied voltage across the load terminals is below a threshold voltage level, and driven substantially instantaneously to another condition wherein said at least portions thereof between the load terminals have a low resistance and are substantially conductors for conducting the flow of current therethrough in either or both directions when the applied voltage across the load terminals is raised above said threshold voltage level and reverting to said one state when the current therethrough drops below a holding current level, the maximum value of the output of said progressively varying input voltage being a great many times the threshold voltage level of said threshold semiconductor device, wherein the semiconductor material of said device is driven into its conducting condition each time the difference between the input voltage and the voltage charge on the capacitor is in excess of the threshold level of the threshold semiconductor device, and reverts to its blocking condition when the capacitor voltage reaches the new input voltage level where current flow therein ceases, the time constant of said series circuit being such that said capacitor charges or discharges substantially instantaneously to the input voltage when the threshold semiconductor device is driven into said conducting condition.

4. In combination, a series circuit including a source of progressively varying input voltage, a capacitor, and a bi-directional threshold semiconductor device with load terminals connecting the device into the series circuit, said threshold semiconductor device including a semiconductor material having one condition wherein at least portions thereof between the load terminals have a high resistance where they act as insulators for blocking the flow of current therethrough in either or both directions when the applied voltage across the load terminals is below a threshold voltage level, and driven substantially instantaneously to another condition wherein said at least portions thereof between the load terminals have a low resistance and are substantially conductors for conducting the flow of current therethrough in either or both directions when the applied voltage across the load terminals is raised above said threshold voltage level and reverting to said one condition when the current therethrough drops below a holding current level, the maximum value of the output of said progressively varying input voltage being at least greater than the threshold voltage level of said threshold semiconductor device, wherein the semiconductor material of said device is driven into its conducting condition each time the difference between the input voltage and the voltage charge on the capacitor is in excess of the threshold level of the threshold semiconductor device, and reverts to its blocking condition when the capacitor voltage reaches the new input voltage level where current flow therein ceases, the time constant of said series circuit being such that said capacitor charges or discharges substantially instantaneously to the input voltage when the threshold semiconductor device is driven to said conducting condition.

5. An analog to digital converter circuit for indicating the voltage range within which an unknown D.C. voltage is located, said circuit comprising a pair of input terminals to which the voltage is to be fed, a capacitor charge circuit including a capacitor and a resistance coupled to said input terminals for building up across said capacitor a voltage gradually increasing to the value of the unknown voltage, signal isolating means coupled across said capacitor for providing in its output a signal following the waveform across said capacitor and which isolates the capacitor charge circuit from the circuit connected to the output of said signal isolating means, and a measuring circuit coupled to the output of said signal isolating means including a series circuit of a second capacitor and a bi-directional threshold semiconductor device with load terminals connecting the device into the measuring circuit, said threshold semiconductor device including a semiconductor material having one condition wherein at least portions thereof between the load terminals have a high resistance where they act as insulators for blocking the flow of current therethrough in either or both directions when the applied voltage across the load terminals is below a threshold voltage level, and driven substantially instantaneously to another condition wherein said at least portions thereof between the load terminals have a low resistance and are conductors for conducting the flow of current therethrough in either or both directions when the applied voltage across the load terminals is raised above said threshold voltage level and reverting to said one condition when the current therethrough drops below a holding current level, the maximum value of the signal at the output of said signal isolating means being in excess of the threshold voltage level of said threshold semiconductor device, wherein the semiconductor material of said device is driven into its conducting condition each time the difference between the voltage output of said signal isolating means and the voltage charge on the second capacitor is in excess of the threshold level of the threshold semiconductor device and reverts to its blocking condition when the second capacitor voltage reaches the new voltage level where current flow therein ceases, the time constant of said series circuit being such that said second capacitor charges or discharges substantially instantaneously to the input voltage when the threshold semiconductor device is driven to said conducting condition.

6. An analog to digital converter circuit for indicating the voltage range within which an unknown D.C. voltage is located, said circuit comprising a pair of input terminals to which the voltage is to be fed, a capacitor charge circuit including a capacitor and a resistance coupled to said input terminals for building up across said capacitor a voltage gradually increasing to the value of the unknown voltage, signal isolating means coupled across said capacitor for providing in its output a signal following the waveform across said capacitor and which isolates the capacitor charge circuit from the circuit connected to the output of said signal isolating means and a measuring circuit coupled to the output of said signal isolating means including a series circuit of a second capacitor and a bi-directional threshold semiconductor device with load terminals connecting the device into the measuring circuit, said threshold semiconductor device including a semiconductor material having one condition wherein at least portions thereof between the load terminals have a high resistance where they act as insulators for blocking the flow of current therethrough in either or both directions when the applied voltage across the load terminals is below a threshold voltage level, and driven substantially instantaneously to another condition wherein said at least portions thereof between the load terminals have a low resistance and are conductors for conducting the flow of current therethrough in either or both directions when the applied voltage across the load terminals is raised above said threshold voltage level and reverting to said one condition when the current therethrough drops below a holding current level, the maximum value of the signal at the output of said signal isolating means being in excess of the threshold voltage level of said threshold semiconductor device, wherein the semiconductor material of said device is driven into its conducting condition each time the difference between the voltage output of said signal isolating means and the voltage charge on the second capacitor is in excess of the threshold level of the threshold semiconductor device and reverts to its blocking condition when the second capacitor voltage reaches the new voltage level where current flow therein ceases, the time constant of said series circuit being such that the second capacitor charges or discharges substantially instantaneously to the input voltage when the threshold semiconductor device is driven to said conducting condition, and pulse counter means responsive to each current pulse resulting from a charging of said capacitor by increasing the count therein by one unit.

7. An analog to digital converter circuit for indicating the voltage range within which an input voltage is located, said circuit comprising a series circuit including a source of progressively varying input voltage to be measured, a capacitor, and a symmetrical bi-directional semiconductor current controlling device including semiconductor material means and two load terminals in non-rectifying contact therewith and coupled in series with said source of voltage and said capacitor, said semiconductor material means being of one conducting type and including means for providing a first condition of relatively high resistance for substantially blocking current therethrough between the load terminals, said semiconductor material means including means responsive to a voltage of at least a threshold value applied to said load terminals for altering said first condition of relatively high resistance of said semiconductor material means for substantially instantaneously providing at least one path through said semiconductor material means between the load terminals having a second condition of relatively low resistance for conducting the current therethrough substantially equally in either direction therethrough, the maximum value of the output of said progressively varying input voltage being a great many times said threshold value, wherein the semiconductor material means of said device is driven into its conducting condition each time the difference between the input voltage and the voltage charge on the capacitor is in excess of the threshold value, said semiconductor material means including means for maintaining said at least one path of said semiconductor material means in its said second relatively low resistance conducting condition and providing a substantially constant ratio of voltage change to current change for conducting current at a substantially constant voltage therethrough between the load terminals substantially equally in either direction therethrough which voltage is the same for increase and decrease in the instantaneous current above a minimum instantaneous current holding value, and providing a voltage drop across said at least one path in its said second relatively low resistance conducting condition which is a minor fraction of the voltage drop across said semiconductor material means in its said first relatively high resistance blocking condition near said threshold voltage value, and said semiconductor material means including means responsive to a decrease in the instantaneous current, through said at least one path in its said relatively low resistance conducting condition, to a value below a minimum instantaneous current holding value for immediately causing realtering of said second relatively low resistance conducting condition of said at least one path to said first relatively high resistance blocking condition for substantially blocking the current therethrough in both directions therethrough.

References Cited

UNITED STATES PATENTS

| | | | |
|---|---|---|---|
| 2,949,602 | 8/1960 | Crowe | 340—347 |
| 3,204,466 | 9/1965 | Henderson | 73—503 |
| 3,259,896 | 7/1966 | Pan | 340—347 |
| 3,271,591 | 9/1966 | Ovshinsky | 307—88.5 |
| 3,281,827 | 10/1966 | Olshausen | 340—347 |

DARYL W. COOK, *Acting Primary Examiner.*

MAYNARD R. WILBUR, *Examiner.*

J. WALLACE, *Assistant Examiner.*